United States Patent [19]

Lipisko et al.

[11] Patent Number: 4,859,375
[45] Date of Patent: Aug. 22, 1989

[54] CHEMICAL REFILL SYSTEM

[75] Inventors: Bruce A. Lipisko, Carlsbad; John C. Schumacher, Rancho Santa Fe; Richard E. Howard, Escondido; Peter T. Randtke, San Marcos; Adrian Sandu, La Mesa; Robert E. Fletcher, Vista; Hans-Juergen Graf, Oceanside, all of Calif.

[73] Assignee: Air Products and Chemicals, Inc., Allentown, Pa.

[21] Appl. No.: 946,828

[22] Filed: Dec. 29, 1986

Related U.S. Application Data

[63] Continuation as PCT US85/01100 filed Jun. 21, 1985, published as WO86/07615 on Dec. 31, 1986.

[51] Int. Cl.4 ............................................. B01F 3/04
[52] U.S. Cl. .................................... 261/20; 137/209; 141/1; 141/83; 261/121.1; 261/52; 261/72.1
[58] Field of Search ............... 137/209, 240; 141/1, 141/25, 83, 95; 261/20, 121.1, 52, 72.1

[56] References Cited

U.S. PATENT DOCUMENTS

| 3,106,844 | 10/1963 | Sonnberg . | |
|---|---|---|---|
| 3,698,870 | 10/1972 | De Jong | 137/209 |
| 3,826,560 | 7/1974 | Schultz | 65/4.2 |
| 3,827,455 | 8/1974 | Lee | 137/613 |
| 4,011,288 | 3/1977 | Assenheimer et al. | 261/121.1 |
| 4,134,514 | 1/1979 | Schumacher et al. | 261/124 |
| 4,169,225 | 9/1979 | Rickert | 137/209 |
| 4,235,829 | 11/1980 | Partus | 137/209 |
| 4,276,243 | 6/1981 | Partus | 261/128 |
| 4,298,037 | 11/1981 | Schumacher et al. | 261/124 |
| 4,545,801 | 10/1985 | Miyajiri et al. | 137/209 |
| 4,563,312 | 1/1986 | Takimoto et al. | 261/121.1 |
| 4,582,480 | 4/1986 | Lynch et al. | 261/121.1 |
| 4,622,988 | 11/1986 | Takimoto et al. | 137/209 |
| 4,676,404 | 6/1987 | Yamazaki et al. | 137/209 |

FOREIGN PATENT DOCUMENTS 1263883 5/1961 France .

OTHER PUBLICATIONS

Patent Abstracts of Japan, vol. 8, No. 283, p. C-258, 25 Dec. 1984, 59-152297.

Primary Examiner—Tim Miles
Attorney, Agent, or Firm—James C. Simmons

[57] ABSTRACT

A system for automatically filling a bubbler, or other vapor delivery system from a reservoir, is disclosed in which the conduit system is purged and pressurized with inert gas, using a unique refill reservoir, level sensing and valving system.

18 Claims, 7 Drawing Sheets

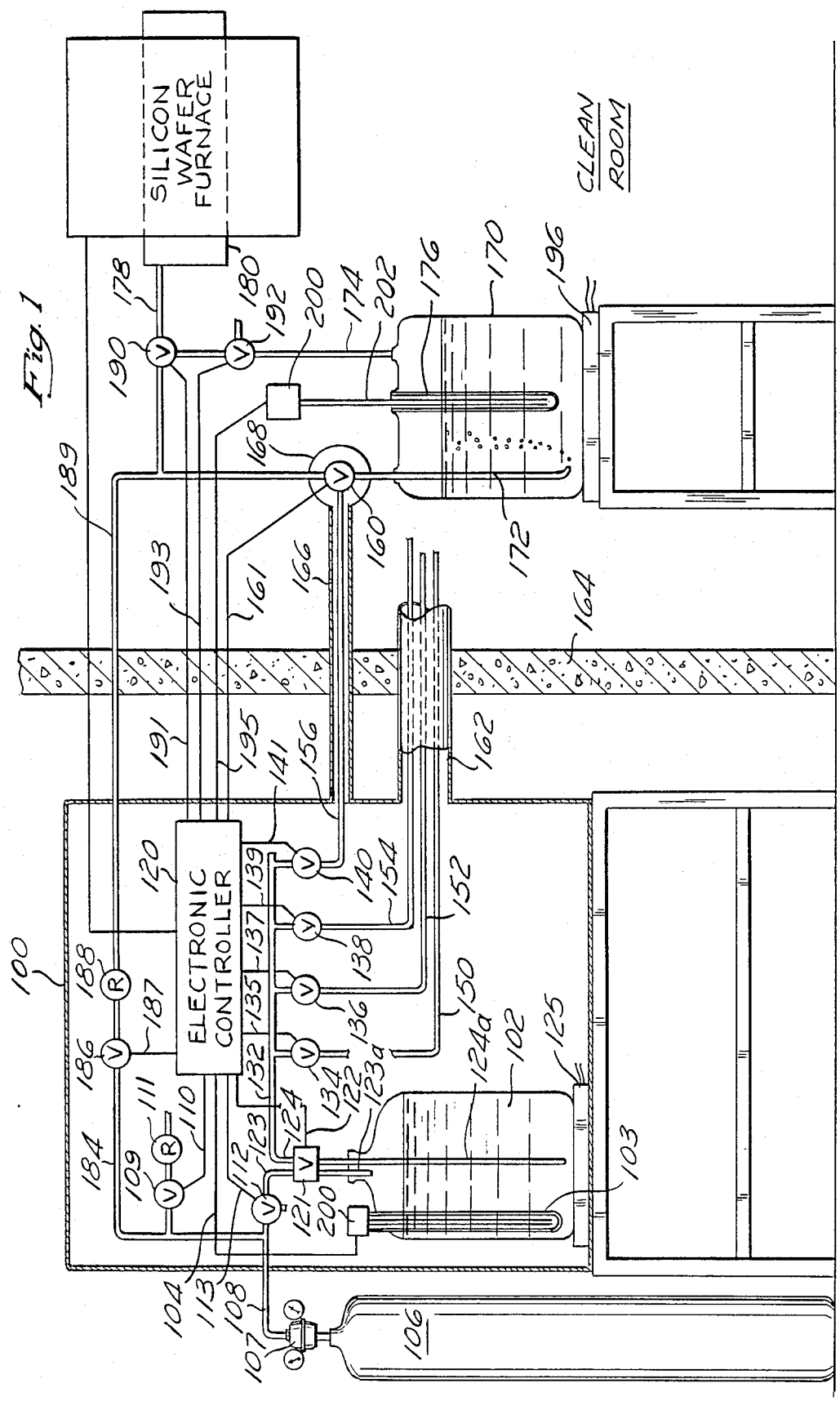

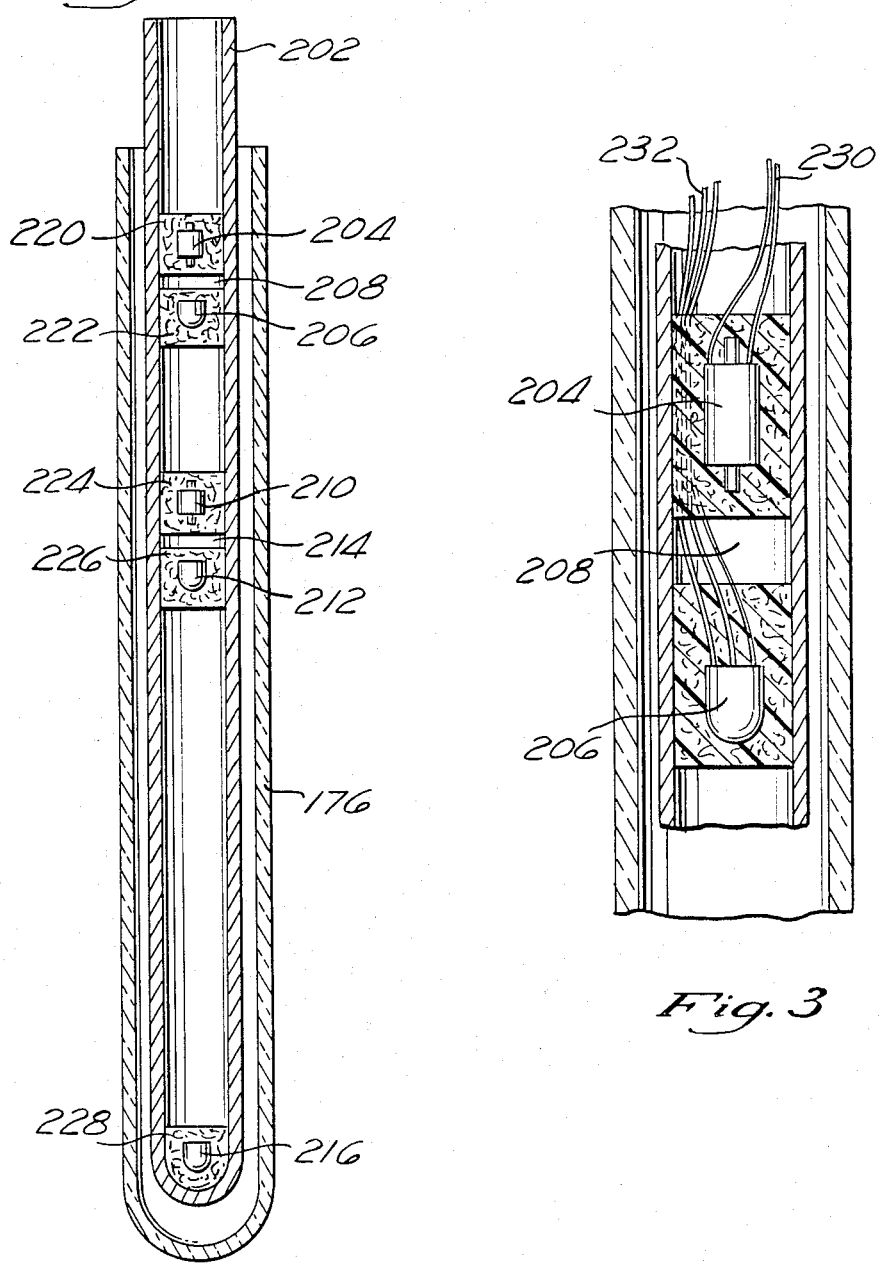

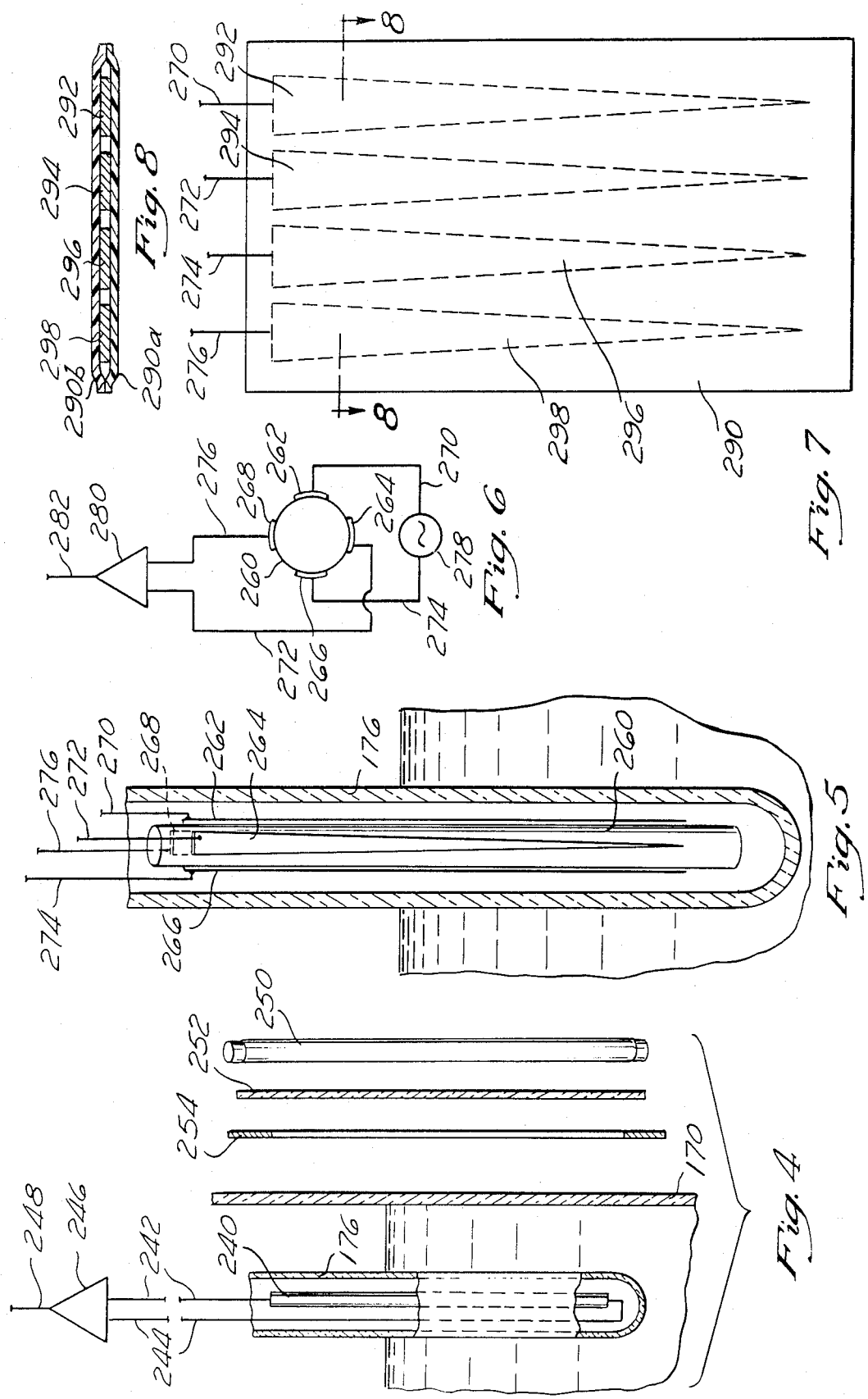

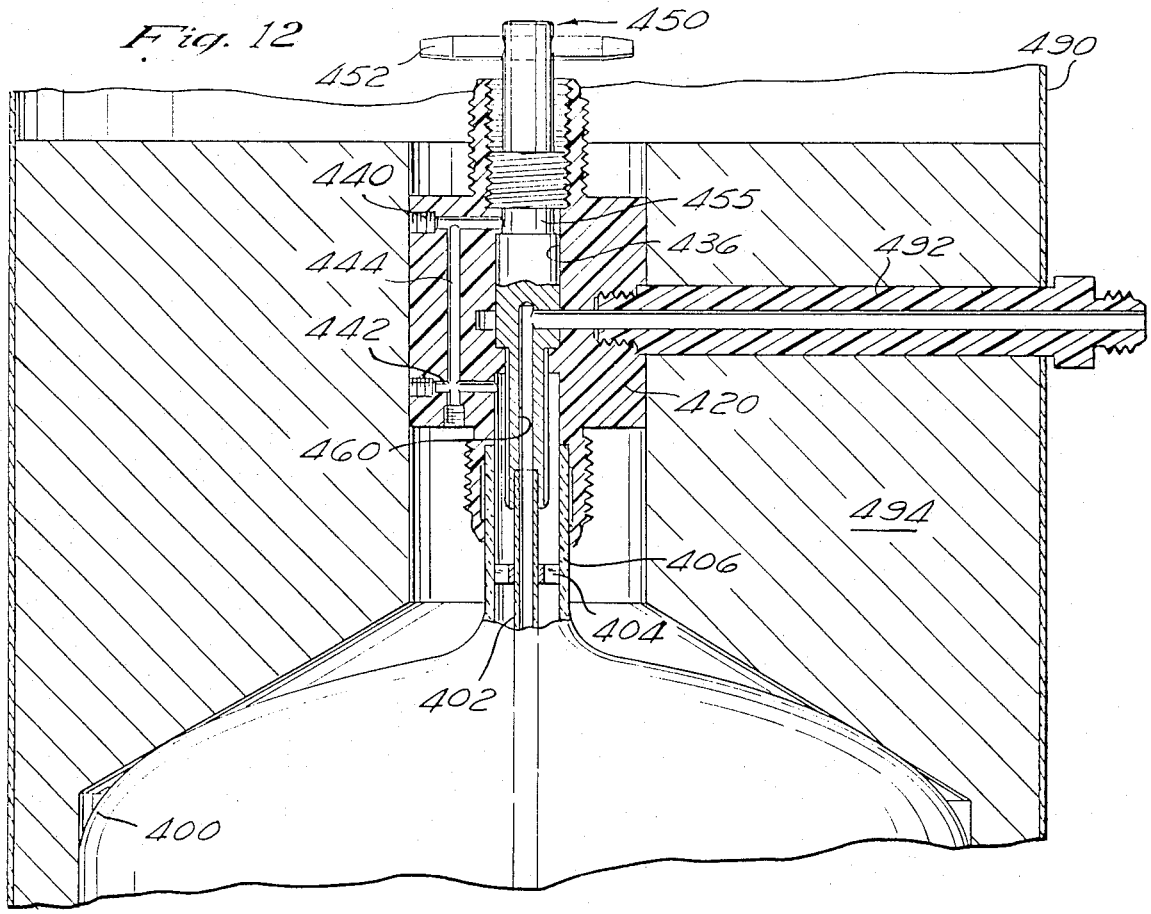
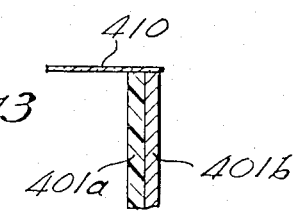
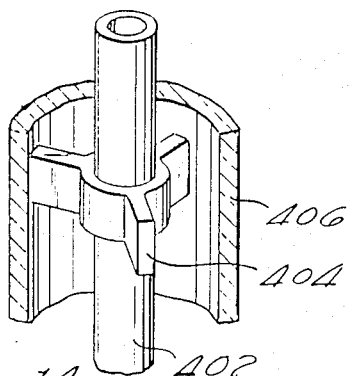
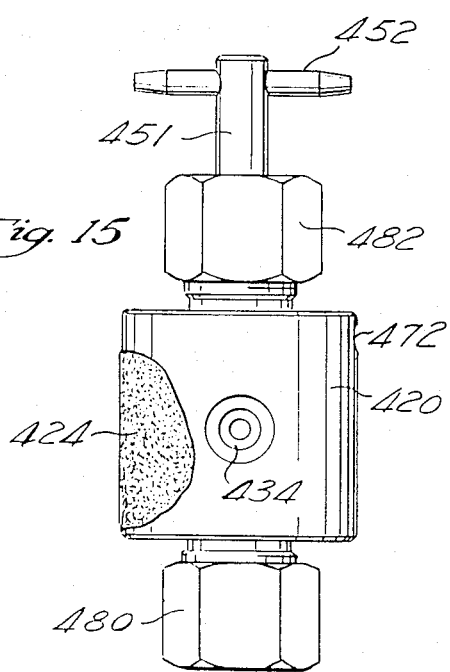

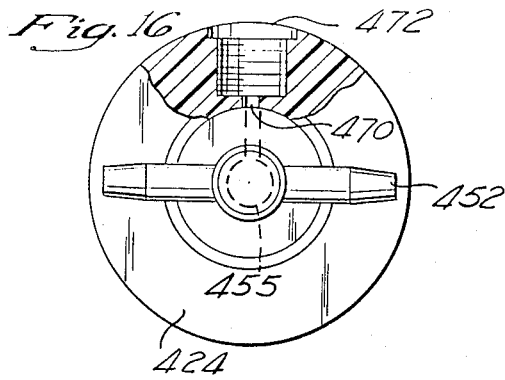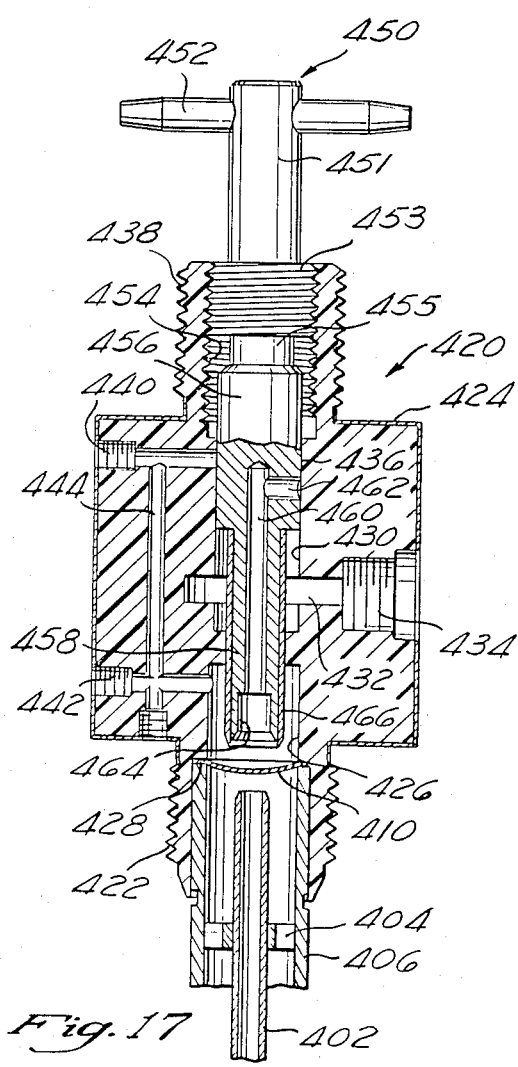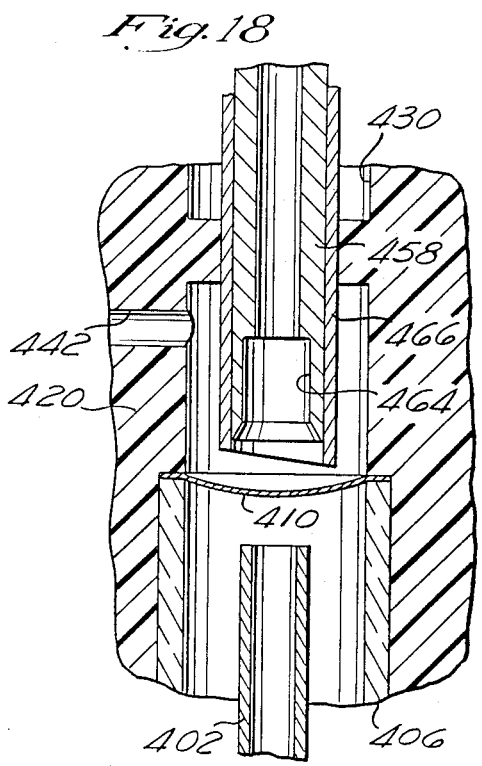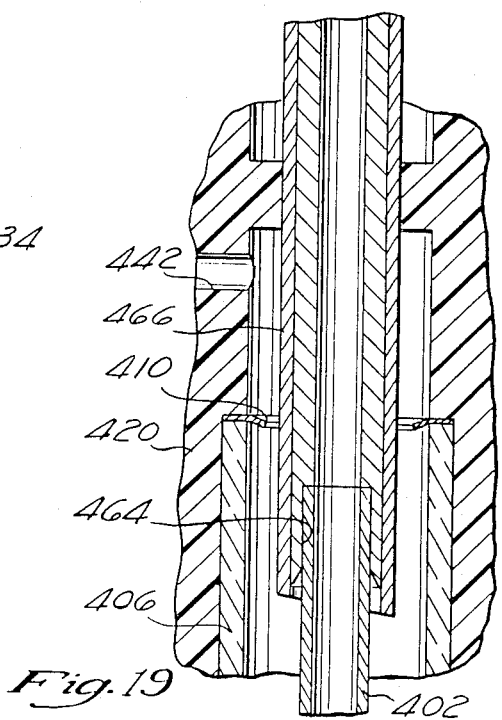

CHEMICAL REFILL SYSTEM

This is a continuation of PCT application U.S./85/01100, filed June 21, 1985, published Dec. 31, 1986, International Pub. No. 86/07615.

FIELD OF THE INVENTION

This invention relates to vapor delivery systems of the type typically used in the semiconductor industry and, more particularly, to a system for refilling vapor delivery systems of this type.

BACKGROUND OF THE INVENTION

The semiconductor industry is very dependent upon sources of ultrahigh purity reagents. Other industries also have high purity requirements, but few compare with the purity requirements in the semiconductor industry. Vapor delivery systems are used in a number of manufacturing processes. For example, vapor delivery systems are used in the manufacture of optical wave guides. Such systems are described in U.S. Pat. Nos. 3,826,560; 4,235,829; and 4,276,243, the disclosure of which is incorporated herein by reference. Thin films are sometimes produced by vapor delivery system technology, see HANDBOOK OF THIN FILM TECHNOLOGY, Maissel and Glang, McGraw-Hill, New York, 1970. Film deposition techniques are generally described, as applicable to the semiconductor industry, in ENCYCLOPEDIA OF SEMICONDUCTOR TECHNOLOGY, Grayson (Ed) John Wiley, New York, 1984.

With particular application to the manufacture of semiconductors, it is known to provide semiconductor devices by reacting a silicon wafer, appropriately prepared with the semiconductor component pattern thereon, with the vapor from liquid source materials or dopants. Among these liquid source materials are boron tribromide, phosphorous oxychloride, phosphorous tribromide, silicon tetrabromide, arsenic trichloride, arsenic tribromide, antimony pentachloride and various combinations of these.

Traditionally, in this industry, these dopants were provided in ampules, typically made of quartz with a stem which can be broken off. The ampule was shipped from the manufacturer of the dopant to the semiconductor producer. The ampule was broken and the material transferred to a bubbler. An inert gas, typically was bubbled through the reagent, partially or fully saturating the gas with the reagent, and then the reagent laden inert gas was fed under controlled conditions into a silicon wafer furnace. All of this, of course, is well-known and somewhat old technology at this point in time. A great step forward was made in this technology with the development by Dr. John C. Schumacher and Dr. Andre' Lagendijk of a bubbler which was suitable for both shipment and use in the process line. This type of bubbler is described in U.S. Pat. Nos. 4,134,514 and 4,298,037. In using bubblers of this type, it was only necessary to purge the conduit lines after the bubbler had been connected, and then open the bubbler. This greatly reduced the amount of contamination and provided a much higher quality product and a more consistent product with a lower reject rate. While this was a great advance in the technology, there yet remains the problem of changing the bubbler. These processes are typically carried out in a clean room, in which access is limited and special clothing is required. Even under the best conditions, the entry of operating personnel into the clean room disrupts the equilibrium which exists there during production. This results from the introduction of different temperature and composition atmosphere from outside the clean room, and simply from the presence of an operator. Each individual introduces with his clothing and with his person certain impurities into the atmosphere. These and other factors tend to reduce the quality of the product, and increase the rejection rate each time an operator has to enter the clean room.

In addition, the physical handling of bubblers filled with these reagents, which tend to be highly poisonous and very reactive, presents a certain safety problem. While with adequate care and suitable safety precautions the processes are carried out with a very high degree of safety, there is some risk always present.

The present invention is designed to reduce the risk and to significantly increase the time between entry of an operator into the clean room and, thereby, improve the efficiency of the process and reduce the reject rate, as well as improve the quality of the product. These and other objects are accomplished by providing a system which eliminates the need to replace the bubbler, or to manually refill it. The bubbler is automatically maintained between a minimum and a maximum level. All of this is accomplished from a refill reservoir using unique and significant process steps and apparatus to prevent contamination and to assure safety. Thus, it is one of the facets of this invention to provide a system for automatically refilling bubblers, or the like, which are used as vapor delivery systems.

SUMMARY OF THE INVENTION

The invention may be described as a system for providing chemically reactive vapor to silicon wafer treating furnaces, and the like, comprising, in combination, a refill reservoir for containing and dispensing high purity, highly chemically reactive reagent, at least one bubbler for at least partially saturating an inert gas stream with reagent vapor, and means for periodically transferring reagent from the refill reservoir through the conduit system into the contactor, flushing reagent out of the transfer means, filling the transfer means with inert gas, maintaining the transfer means under pressure with inert gas between the periodic transfer of reagent, and monitoring liquid levels in the reservoir and the bubbler and means for returning residual chemical from the bubbler to the reservoir.

While many specific and general adaptations may be made, in a preferred form, the conduit system of means for periodically transferring reagent comprises an inner conduit comprised of a chemically inert polymeric material, TEFLON (TM) polytetrafluoroethylene, for example, and an outer conduit of gas and moisture impervious material, stainless steel, for example, and further comprising means for maintaining an inert atmosphere between the inner and the outer conduits.

In one specific aspect, preferred but not essential, the conduit system of means for periodically transferring reagent comprises an inner conduit comprised of a chemically inert polymeric material, and an outer conduit of gas and moisture impervious material, and at least one valve enclosed in a substantially gas tight enclosure, and further comprising means for maintaining an inert atmosphere between the inner and the outer conduits, and inside the enclosure around the valve.

While the system includes, in one desired embodiment, a refill reservoir for containing and dispensing ultrahigh purity highly chemically reactive reagent, at least one bubbler comprising a reagent reservoir, an inlet tube for introducing inert gas into the contacter to cause said gas to contact the reagent, and an outlet tube for carrying inert gas at least partially saturated with reagent vapor from the contacter means, including conduit for transferring reagent during a first time period from the refill reservoir through the conduit into the bubbler, flushing reagent out of the conduit, filling the conduit with inert gas, and maintaining a predetermined pressure of inert gas in said conduit between the periodic transfer of reagent therethrough, means for feeding a stream of inert gas into the bubbler to be at least partially saturated with reagent only during a second time period, the first and second time periods alternating with time, many specific variants and additions of specific preferred elements of the combination are contemplated.

For example, the system may include means for sensing the level of reagent continuously, or at predetermined levels in the bubbler, and for controlling the reagent transferring means and the inert gas stream feeding means for feeding inert gas into the contacter only when the reagent is above a predetermined level, and for transferring reagent into the bubbler only when the reagent in the contacter is at or below a predetermined level.

In a highly unique and novel arrangement, the system includes means including a conduit system for transferring vapor or liquid reagent during a first time period from the refill reservoir through the conduit system into the bubbler, flushing reagent out of the conduit system, filling the conduit system with inert gas, and maintaining a predetermined pressure of inert gas in said conduit system between the periodic transfer of reagent therethrough, a substantially gas tight enclosure for the refill reservoir and means for providing inert gas at a predetermined pressure to the enclosure to maintain the refill reservoir in an inert atmosphere, and may also include means for providing inert gas at a predetermined pressure and rate to the refill reservoir, and means for feeding a stream of inert gas into the bubbler to be at least partially saturated with reagent only during a second time period, the first and second time periods alternating with time.

Though not at all limiting, the preferred refill reservoir comprises a container forming a reservoir and a reduced neck portion, a withdrawal tube supported in the container, the upper end of the withdrawal tube extending into the neck portion of the container, together with a valve assembly mounted on the neck of the container in gas tight relation thereto. This unique valve assembly comprises a valve body having formed therein a passage for receiving a valving member and inlet and outlet ports in fluid communication with said passage, and a valving member received in moveable gas sealing relation in the passage in the valve body, the valving member having formed therein a withdrawal passage in alignment with the withdrawal tube in the container, said valving member closing the inlet and outlet ports in the closed position of the valve, and opening the inlet and outlet ports in the open position thereof. The withdrawal tube and the withdrawal passage are so constructed and arranged, when the valve is in the open position, to permit the withdrawal passage to engage the withdrawal tube in fluid communication therewith to permit flow of liquid from the container through the valve to the outlet port.

Again, in a very highly desirable and preferred, but non-limiting, embodiment, the refill reservoir further comprises a breakable seal across the neck of the container, the valve assembly comprising means for breaking said seal upon opening of the valve, also, preferably, but non-essentially, the valve body has a second passage formed therein defining a fluid conduit between the upper portion of the container and the inlet port of the valve when the valve is in the open position.

A particularly preferred, but quite optional, level sensing means comprises an elongate, annular thermally conductive sleeve, an electric heater in the sleeve in thermal contact with a first zone of the sleeve, a temperature sensor in the sleeve in thermal contact with a second zone of the sleeve; the heater and the sensor being spaced from each other longitudinally along the sleeve and being so constructed and so mounted in the sleeve as to be in thermal communication with each other substantially only through the sleeve.

One form of level sensing means which is recommended, but not required, comprises an elongate, annular thermally conductive sleeve, a first electric heater in the sleeve in thermal contact with a first zone of the sleeve, a first temperature sensor in the sleeve in thermal contact with a second zone of the sleeve; the heater and the sensor being spaced from each other longitudinally along the sleeve, and being so constructed and so mounted in the sleeve as to be in thermal communication with each other substantially only through the sleeve, the longitudinal position of the space between the first heater and first sensor in the sleeve defining an upper liquid level in the bubbler, a second electric heater in the sleeve in thermal contact with a third zone of the sleeve, a second temperature sensor in the sleeve in thermal contact with a fourth zone of the sleeve; the heater and the sensor being spaced from each other longitudinally along the sleeve, and being so constructed and so mounted in the sleeve as to be in thermal communication with each other substantially only through the sleeve, and the longitudinal position of the space between the second heater and second sensor in the sleeve defining a lower liquid level in the bubbler.

While any level sensing device may be used, one preferred sensing device comprises an optical sensing system wherein a continuous level signal is generated indicating the liquid level in the bubbler at any given time. Such a device comprises an elongate photodiode inserted in a transparent or translucent well in the liquid, and a parallel light source which exposes the photodiode to a uniform collimated light intensity along the length thereof. As the liquid level rises or lowers, the light passes through more or less of the liquid and is absorbed and diffused therein; consequently, the total light striking the photodiode is directly proportional to the liquid level.

Another level sensing device comprises a capacitance sensor comprising a plurality of electrically conductive strips affixed adjacent the bubbler, typically in a level sensing well, or on the wall of the bubbler. A signal energizes one or more strips, and is capacitively coupled to the other. The amount of coupling is a function of the presence or absence of liquid in the bubbler. The output signal is proportional, either in amplitude or frequency, to the level of the liquid in the bubbler.

Yet another method is by weighing, using a load cell placed in the base of the cabinet into which the reservoir are inserted.

While particular types of equipment may be used, the invention lies in the combinational features of the invention, and also in particular instances. Facets of the invention lie in certain unique elements as well as combinations of elements, features, and steps. Many equivalent elements will be recognized once the concept of the invention is clearly in mind.

The inventive concept includes process and method facets, as well as the individual elements, and the system comprising particular combinations of elements.

The process in one facet comprises providing a stream of inert gas at least partially saturated with ultrahigh purity reagent which is highly reactive with oxygen and moisture to a reaction zone by maintaining a supply of the reagent in a refill reservoir in an inert, gas impervious shipping container, transferring reagent from the refill reservoir to a gas-reagent contacter periodically through a conduit system, flushing reagent out of the conduit system between each transfer of reagent, maintaining the conduit system under inert gas pressure between each transfer of reagent, passing a stream of inert gas through the contacter to at least partially saturate said inert gas stream in between each transfer of reagent.

The process may also include maintaining an envelope of inert gas around the refill reservoir, and may also include the step of maintaining an envelope of inert gas around the conduit.

Viewed in another facet, the process may be considered as protecting a reagent which is highly reactive with oxygen and moisture by introducing the reagent in ultrahigh pure condition into a clean container which is inert to the reagent, which is impervious to air and moisture, and which comprises a neck portion and a withdrawal tube extending from the neck portion to a point proximate the bottom of the container, sealing the neck of the container above the upper end of the withdrawal tube, securing a breakseal valve on the neck of the container; and, at the point of use, moving the valving member of the breakseal valve in a passage in the valve body to break the seal on the neck of the container and engage the withdrawal tube to thereby permit flow of liquid reagent through the withdrawal tube and valving member to the point of use of the reagent. Moving the valving member preferably comprises moving the valving member axially of the withdrawal tube through the breakseal into engagement with the withdrawal tube.

Without limiting the process of protecting reagent which is highly reactive with oxygen and moisture, it may be viewed as introducing the reagent in ultrahigh pure condition into a clean container which is inert to the reagent, which is impervious to air and moisture, and which comprises a neck portion and a withdrawal tube extending from the neck portion to a point proximate the bottom of the container and sealing the neck of the container above the upper end of the withdrawal tube. The process may also include securing a breakseal valve on the neck of the container, the breakseal valve comprising a valving member in a passage in a valve body so constructed and configured as to break the seal on the neck of the container and engage the withdrawal tube upon being moved in the body to the open position of the valve.

As a production process, the invention includes the steps of providing a stream of inert gas at least partially saturated with ultrahigh purity reagent which is highly reactive with oxygen and moisture to a reaction zone involving passing a stream of inert gas through a gas-liquid contacter containing said reagent to at least partially saturate said inert gas stream, maintaining a supply of the reagent in a refill reservoir in an inert, gas impervious shipping container, periodically ceasing to pass the stream of inert gas through the contacter, and during said period of cessation, transferring reagent from the refill reservoir to the contacter through a conduit system. Flushing reagent out of the conduit system between each transfer of reagent and maintaining the conduit systems under inert gas pressure between each transfer of reagent are also within the scope of the invention.

The process may also include the steps of sensing the level of reagent in the contacter, controlling the periods of cessation as a function of the reagent level, controlling the amount of reagent transferred as a function of the reagent level, as well as maintaining an envelope of inert gas around the refill reservoir and maintaining an envelope of inert gas around the conduit.

The method and system of this invention also comprises the steps of backflushing residual chemical from the bubbler into the reservoir. This backflush may be accomplished at will, but generally is carried out when the reservoir is being readied for return to the chemical thus being returned to the supplier for reprocessing to remove impurities which tend to build up in the bubbler over long periods of operation. This feature of the invention permits the bubbler to continue in operation virtually indefinitely and, thus, permits the entire installation, except the reservoir itself to be permanently connected, and to require service only when a change in the system is required, rather than with each new batch of chemical supplied in the bubbler as has been the practice of the prior art. Means and process steps are, according to this invention, provided to accomplish this major step forward in the industry.

Another feature of the invention of significance is the process and means of replenishing the bubbler by vapor distillation from the reservoir. By this process, and the system provided therefor, such impurities as may be residual in the chemical remain in the reservoir while the pure, distilled reagent chemical is transported to the bubbler. The residual chemical in the reservoir is returned to the manufacturer and re-manufactured or reprocessed to provide high purity reagent.

Many combinations, permutations, adaptations and modifications of the specific exemplary embodiments described herein are within the scope of the inventive concept.

BRIEF DESCRIPTION OF THE DRAWINGS

FIG. 1 is a schematic view of the overall system of this invention, showing the source of inert gas, refill reservoir, enclosing envelope, bubbler/vaporizer, flush and return line, and a silicon wafer furnace as exemplary of the kind of treatment device which may be provided with high purity reagent according to this invention.

FIG. 2 is an enlarged view of a level sensor, shown largely in cross section, and cutaway, which may be used as one of the components of this invention.

FIG. 3 is a still further enlargement of a section of the level sensor of FIG. 2, showing the detailed relationship of a heater and temperature sensor.

FIG. 4 is a side view, in partial cross-section of an alternative, photodetector-light actuated level sensor suitable for use in this invention.

FIG. 5 is a side view, in partial cross-section of another alternative level sensor which operates on a electrical capacitance principle.

FIG. 6 is a schematic view of the electric connection of the level sensor of FIG. 5.

FIG. 7 is a variation of the sensor FIG. 6 wherein the capacitance sensor is a sandwich structure which may be secured to or placed adjacent a liquid container.

FIG. 8 is a cross-sectional view of the sensor of FIG. 7 taken in the direction of the arrows as shown in FIG. 7.

FIG. 12 is a side view, in partial cross-section and cutaway, of the top of a refill reservoir and valving system which is especially preferred in this invention.

FIG. 13 is a view in cross-section of a detail of the neck portion of the reservoir shown in FIG. 7.

FIG. 14 is a detail in perspective and partial cross-section of the neck of the reservoir as shown in FIG. 12.

FIG. 15 is a view of the valve which forms part of the assembly of FIG. 12.

FIG. 16 is a view of the valve which forms a part of the assembly of FIG. 12, FIG. 16 being a top plan view of the valve shown in FIG. 15, turned 90 degrees to the eft, compared with that shown in FIG. 15, and showing the portion of the valve in which port 470 and port 472 are formed in partial cutaway cross section.

FIG. 17 is a side view in cross-section and showing the details of the valve of FIGS. 15 and 16, affixed in place on the reservoir of FIG. 12.

FIG. 18 is a side view in cross-section of a detail of a portion of the valve and the neck of the assembly shown in FIG. 12, before breaking the seal.

FIG. 19 is the same view as FIG. 18, showing the position of the valve after breaking the seal.

DESCRIPTION OF THE PREFERRED EMBODIMENT

Figure 9:
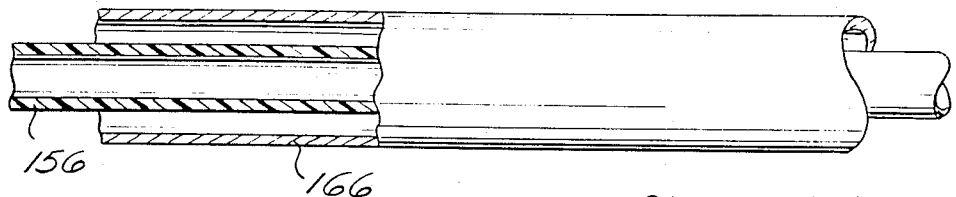
FIG. 9 is a view of a portion of an enclosed conductor system, in partial cross-section according to this invention.

The following description of the preferred embodiment of the invention is nonlimiting. It will be understood that there are many alternatives to the various components and elements of the invention which may be interchanged herewith. Certain of the components are shown in preferred form and described in detail in their most preferred form, but the invention is not necessarily limited to any particular component. A reasonable range of equivalence for each of the elements and components and variations in the precise assemblage of components in the system is contemplated as being within the scope of the invention.

Reference is made now, first, to FIG. 1, which depicts the overall system of the invention. As shown, an enclosure 100 is provided for certain important elements of the invention. This enclosure 100 may take any desired configuration, but generally would be a metal or high impact polymeric enclosure with a tight fitting door. The enclosure 100 should be generally gas tight; although it is not essential that it be totally gas tight, since it will normally be kept at a pressure above atmosphere to prevent contamination. Because it also serves an important safety function, the enclosure 100 is preferably substantially gas tight, such that no significant amount of gas will flow through the walls or around the door thereof. Details are not described because enclosures of this type are well known, and can be fabricated, typically, by welding of stainless steel and using conventional engineering and hardware techniques.

Enclosed within the enclosure 100 is a reservoir 102. This is the refill reservoir of the invention. This reservoir is designed to maintain a large supply of ultrahigh purity chemical reagent which is used to periodically replenish a bubbler or other gas contacter. The drawing depicts this simply in the form of a carboy, but it will be understood that specially designed refill reservoirs may be required, one of which is described in detail hereinafter. Any kind of reservoir 102 which is chemically inert to the contained reagent, and which can be suitably connected to a conduit system for carrying the reagent to a gas contacter may be used. The reservoir may include a sensor well 103 for receiving a level sensor 200, which will be described in detail hereinafter, the sensor being electronically connected to a central electronic control system shown at 120, the overall function of which will be shown as it relates to the operation of the system hereinafter.

A source of inert gas, 106, typically fed through a conventional regulator 107, and a conduit 108, provides a source of inert gas for the entire system. It will be understood that several sources of inert gas, which gas may all be the same or different inert gases, may be provided for the various aspects of the invention. For simplicity in depicting the invention and describing it, however, and only for this purpose, a single source of inert gas is described.

One of the purposes and uses of the inert gas is to pressurize the interior of the gas tight enclosure 100, and certain conduit enclosures as will be described. This pressurization is accomplished, in the exemplary embodiment which is depicted, through a valve 109, which may be attached through a line 110 to the electronic controller 120, and through a regulator 111. Through this system, the inert gas is dispensed into the interior of the gas tight enclosure, and maintains the enclosure at a super-atmospheric pressure of inert gas. This envelope of inert gas serves two purposes, principally. First, it maintains a substantial part of the reagent handling system in an inert gas atmosphere, thus eliminating one of the major sources of contamination. Secondly, because the system is largely enclosed, and is in an inert atmosphere, there is an additional safety factor added in the event there is a spillage, breakage, or failure of some of the components for handling the reagent. As previously noted, the reagent is typically very highly reactive with oxygen and with moisture. Thus, it is important that the reagent be kept out of contact with the air, for safety reasons, and that the containment system desirably avoid or minimize contact with air to prevent contamination of the reagent by oxygen and/or moisture reaction with the reagent.

The inert gas is used to transport chemical reagent from the reservoir to the bubbler. This transport may be accomplished by pressurized liquid flow from the reservoir to the bubbler, or by vapor distillation from the reservoir, the vapor being carried by the inert gas to the bubbler to replenish the bubbler either intermittently or continuously.

Liquid transfer is accomplished as the inert gas flows through valve 112, which may also vent into the containment system, and through valve 121, controlled by controller 120 through line 122, and through conduit 123 which communicates with gas space above the chemical in reservoir 102. The pressure in the gas space forces liquid chemical to flow from the reservoir through conduit 124 and valve 121, and then into the manifold system 132. The temperature of the liquid in the reservoir is maintained by any suitable heater/controller, such as that indicated at 125 which provides heat sufficient to maintain the liquid in the reservoir at the desired temperature, T-1. Vapor distillation transfer is accomplished by positioning valve 121, by means of controller 120 and line 122, in its other position (valve 121 being a conventional four-way, two position valve) such that the inert gas flows in through conduit 124, and the reagent vapor is carried by saturated inert gas by conduit 123 into the manifold 132. The conduit system between the reservoir and the bubbler is maintained at least as high as T-1 to prevent condensation in the line. Other facets of this process will be discussed later, but, briefly, if the temperature of the liquid in the reservoir 102, T-1, is higher than the temperature of the liquid in the bubbler, T-2, the net effect is to distill reagent from the reservoir and condense it into the bubbler. The temperatures T-1 and T-2 are controllable and controlled to provide either periodic transfer of reagent or to provide continuous replenishment of the liquid in the bubbler.

Controller 120 may be of any standard engineering design. There will have to be some customization, in order to provide the particular control mechanisms, but the circuitry, switching, etc., of the controller and of the valves and other control mechanisms are well-known in the art and need not be described. Reference is made to the standard electronic and process control handbooks for various examples of controllers which may be adapted to provide the electronic control functions of this invention.

Reagent, either liquid or vapor, flows through one or more valves, as desired. In the exemplary embodiment there are four valves, valve 134 which is controlled by a line 135 from the electronic controller, valve 136 controlled by line 137, valve 138 controlled by line 139, and valve 140 controlled by line 141, all being controlled, according to principles to be described hereinafter, by the electronic controller. Manifolding is a convenient option, but is certainly not essential. It will be noted that in the preferred embodiment all of the valving and control mechanisms are in the gas tight enclosure 100 for the reasons previously discussed.

In the manifold example, the output of these valves flows through separate conduits, i.e., the conduits 150, 152, 154 and 156. The operation of the system will be described with reference to valve 140 and conduit 156, it being understood that the same or similar systems would be connected to each of the other conduits if manifold operation is desired. The refill reservoir 102 may be used to refill a substantial number, typically 3, 4 or 5 bubblers.

At this point it is useful to describe the overall layout of a typical system according to this invention. It is preferred, for reasons previously discussed, that the source of reagent be kept separate from the clean room which contains the treatment furnaces, or areas, to minimize the contamination in the clean room. Thus, the conduits 150, 152 and 154 flow through an enclosing envelope 162 through a wall 164 into the clean room. In like manner, the conduit 156 flows through a conduit 166 through the wall 164 into the clean room. As will be apparent from the drawing, the envelopes 162 and 166 are maintained at a positive pressure of inert gas, thus enclosing the entire conduit system in an inert atmosphere. It should be noted that one envelope may be used for several conduits, or each conduit may have its own envelope as is convenient. It will also be understood that separate sources of inert gas may be provided for the various envelopes if desired.

The invention will be described from this point on as if it were a single reservoir-single bubbler system, which is the basic inventive concept, it being understood that the system as described hereinafter may be duplicated as desired for manifold operation. Thus, the conduit flow path through valve 140, conduit 156, and to valve 160 will be described as exemplary.

The valve 160 is controlled by means of a line 161 from the controller 120, and permits the transfer of reagent into the bubbler 170. It also permits, if desired, the flow of inert gas through valve 160 to backflush the conduit-valve system 156, 140, 132 and 120 into the reservoir.

The bubbler and its function is fully described in U.S. Pat. No. 4,134,514, issued Jan. 16, 1979, to Dr. John C. Schumacher and Dr. Andre' Lagendijk. It will be understood that the use of this type of bubbler is the most common contemplated use of the invention and is adequately exemplary of the invention, but is intended to be only exemplary. The system may include any kind of liquid-gas contact mechanism, e.g., vaporizer, in which it is desired to provide a supply of gas, typically, but not necessarily, inert gas which is wholly or partially saturated with the vapor of a reagent. The exemplary bubbler comprises the overall reservoir, a bubbler inlet tube 172, an outlet tube 174 for the partially saturated gas, and preferably a well 176 for enclosing a level sensing device.

In the exemplary embodiment, the saturated or partially saturated inert gas, carrying the reagent, flows through a valve 192, the function of which will be described, and a line 178 into a silicon wafer furnace 180. Again, it is to be clearly understood that the silicon wafer furnace is merely a very common and important usage of the invention, but is nonlimiting. Any furnace, or other treatment device which requires a gas carrying a vapor is contemplated as being within the scope of the invention.

In the preferred form of the invention, a separate source of inert gas is provided to the gas-liquid contacter 170. Inert gas is caused to flow through a conduit 184, a valve 186, controlled by the electronic controller 120 through line 187, and a regulator 188 if desired, and through a conduit system 189 to the valve 160. Thus, the valve, in one particular embodiment, typically permits either the introduction of liquid into the bubbler from the refill reservoir, or inert gas into the bubbler inlet 172. It is one of the important facets of this invention, although not necessarily critical, that the valve 160 is also enclosed is a gas tight envelope 168 and maintained at a positive pressure with inert gas, again eliminating the possibility of contamination by the atmosphere.

The inert gas is also caused to flow through a valve 190, controlled by a line 191 from electronic controller 120, and through the line 178 into the silicon wafer furnace.

A valve 192 is provided in the outlet conduit system of the bubbler, i.e., in the conduit connected to outlet 174 of the bubbler, which permits venting and flushing of the inert gas conduit system periodically to purge any impurity which may accumulate, and also to permit and cause backflushing of the liquid reagent from the bubbler to the reservoir. The valve 192, controlled by controller 120 through line 193, thus permits inert gas pressure to be applied in the top, gas space of bubbler 170. At the same time, controller 120 will open the vent port of valve 112, and the conduit system from inlet bubbler conduit 172 through valve 160, conduit 156, valve 140, manifold 132, valve 122 and conduit 124 in the reservoir. The inert gas pressure in the bubbler thus backflushes the liquid from the bubbler into the reservoir This may, of course, be done at will through controller 120, but will typically be done only when the reservoir is to be returned to the reagent manufacturer for refill. This is a very important feature because the impurities in the reagent and introduced from the system, though small, will accumulate in the bubbler, and, without the backflush, would continue to accumulate over a very long period of time. As the period of operation continued, the purity of the reagent to the furnace would continue to decrease. By the present invention, any impurities, whether dissolved or particulate, will be backflushed into the reservoir with each change of reservoirs.

The temperature of the liquid in the bubbler, T-2, is maintained by any desired heater/controller, such as shown at 196. Temperature controlling heaters are readily available in many configurations, and any of a large number may be used to maintain T-1 in the reservoir, and T-2 in the bubbler.

According to one aspect, a facet of the invention resides in the design and construction of a level sensing system which includes an electronic transmitting device 200 which transmits a level signal through line 201 to the electronic controller 120 from a level sensor 202, one particular embodiment of which will be described in detail hereinafter. It is to be understood, however, that the invention does not reside, in its overall scope, within the design of the level sensor, but rather is based, insofar as the system is concerned, upon the overall concept, operation, construction and configuration of the system taken in combination, and contemplating all of the advantages, results and functions thereof.

Before leaving the description of FIG. 1, it is desirable to discuss the operation of the system in its overall aspects and the advantages, functions and purposes thereof.

A typical operation of the system is now described as merely exemplary of the invention. It will be understood that the precise sequence and mode of operation may vary somewhat, depending upon the type of treatment zoned or furnace which is being fed, and upon the kind of product being produced. Thus, the following description is merely exemplary.

Considering the invention as designed to provide a stream of inert gas which is either saturated or partially saturated with reagent to a silicon wafer furnace, the overall flow of gases and liquids will be as described. Taking the system at an equilibrium operating state, with the silicon wafer furnace in operation, the flow of gases is as follows: The inert gas flows from the inert gas source, which includes the cylinder of nitrogen, or other inert gas such as argon, shown at 106 through the regulator on conduit system 108, and through the regulated valve and conduit system 184–189, and the valve 160, and is introduced through the bubble tube 172 below the surface of the reagent in the bubbler 170. As the gas bubbles up through the reagent, it becomes either saturated, or partially saturated, depending upon the rate of flow, the depth of reagent, the temperature, etc., with the reagent. The gas then flows out through the outlet tube 174 of the bubbler, and to the inlet tube 178 into the silicon wafer furnace 180. There may be provided, in addition to this gas flow, other streams. For example, other streams of inert gas, or reactive gas, or reagents, may also be provided. These are not part of this invention, however, and would be provided separately and independently of this invention, depending upon the precise reaction which was desired to be carried out.

It should also be noted that in certain operations, a separate source of gas would be provided for bubbler operation during the treatment. For example, in some operations, a separate source of hydrogen could be bubbled through the reagent in the bubbler 170 and fed to the silicon wafer furnace. In this instance, of course, a separate gas supply would be provided since inert gas is necessary for protecting the system from contamination and providing safety. This is but a minor detail in the operation, however, and does not change the principle of operation of the invention.

The system, as thus described, may be considered the equilibrium system. During this period of time the silicon wafer furnace is in operation, the reagent-laden gas is being provided to the wafer furnace, and no changes are taking place. During this time, the level sensor system 200–201, continues to sense the level of liquid in the bubbler, the sensor 202 being received, preferably, in the well 176 which extends downwardly toward the bottom of the reservoir.

When the treatment in the silicon wafer furnace, or such treatment zone as is being fed by the system, is complete, the reagent vapor-laden gas stream may be diverted to another furnace, operating in the same manner, or the silicon wafer furnace may be cooled, the wafers taken out, a new load of wafers placed therein, and the wafer furnace placed back in operation. If, however, the reagent in the bubbler 170 is below a predetermined point, the level of which is being transmitted through the level sensing system 200–202 to the electronic controller, the electronic controller will prevent operation of a silicon wafer furnace until the liquid level in the bubbler is sufficiently high to provide a complete run in the silicon wafer furnace. This automatically prevents the loss of one production run in the furnace which would occur if the bubbler should get too low on liquid during the run. Once the liquid level is at or below a predetermined minimum point, the following sequence occurs. The valve 190 is shut off, and the valve 160 is changed, by means of the control line 161, to close off the flow of gas from conduit 189, and to open the bubbler tube into fluid communication with the conduit 156.

The valves 112 and 121 are opened to permit inert gas to pressurize the refill reservoir 102, by way of conduit 123a, and the reagent is caused to flow from conduit 124 through the manifold 132, valve 140, being controlled by line 141 from controller 120, and through conduit 156, thus causing the reagent to flow into the bubbler, or other gas-liquid conduit reservoir.

Alternatively, valve 121 may be opened to the inert gas flow from conduit 123, through valve 121, to conduit 124, thus opening the outlet through conduit 123 directly into manifold 132 and ultimately into the bubbler. This may be done intermittently to refill the bubbler when a minimum level is sensed, or it may be done continuously. When continuous refilling of the bubbler 170 is carried out, the inert gas stream through the reservoir also carries the reagent to the furnace. Additional gas may be provided through valve 160 as desired. In this feature of the invention, the reservoir temperature T-1 is maintained higher than the bubbler temperature T-2, and preferably the conduit between the reservoir and the bubbler is maintained at least as high as T-1. Thus, the reservoir becomes the evaporator, and the bubbler the condenser, while at the same time vapor is carried from the bubbler into the furnace.

It is important to recognize at this point that while in the exemplary embodiment, largely to illustrate the invention in its simplest form, the liquid reagent is caused to flow through the inlet bubble tube, this is not necessary. Indeed, the tube on the bubbler which is conventionally used for filling the bubbler at the factory may be used as the input for the liquid reagent during the refill cycle. The operation of the system, however, is the same regardless of whether or not the liquid flows in through the bubbler or through a separate fill tube. For simplicity in illustration, the refill is shown through the bubbler tube.

Once the liquid in the bubbler reaches a predetermined maximum level, the valve 140 is closed to liquid flow, and is opened to gas flow through manifold 132, thus flushing out of the conduit system all of the liquid reagent. This provides important safety protection, since the liquid is maintained in the conduit system only during the refill cycle, and, also, minimizes contamination since the reagent is not held in the conduit system which has large surface area exposure. The conduit system is maintained at a positive pressure with inert gas.

The amount of liquid reagent which is caused to flow from the refill reservoir 102 to the bubbler 170, can be controlled either by sensing the maximum level, using the level sensing system 200-202, and actuating the valve 140 as a function of the level of liquid in the bubbler, or a timer in the electronic controller may be used to simply cause the flow of liquid for a predetermined period of time. Thus, once the liquid reaches a certain minimum level, a predetermined quantity of liquid, controlled by the time of flow, is simply readmitted into the bubbler system to bring it up to a predetermined maximum level. Either of these techniques may be used with the present invention.

Once the bubbler is refilled, the valve 160 returns to its operating position. Inert gas from conduit 189, or from conduits 156 and 189, flows through the inlet bubbler tube 172, through the outlet tube 174 and into the silicon wafer furnace as previously described.

It will be apparent from the foregoing description that by means of this system, a number of safety and purity functions are accomplished. Of great importance is the fact that it is no longer necessary to replace the bubbler, and, consequently, is not necessary to open the clean room. As previously described, there is a great disturbance created in the manufacturing operation once the clean room is opened. This occurs because a new inflow of gas and other atmospheric contaminants comes into the clean room from the outside, and, perhaps most importantly, simply the presence of an operator in the clean room disturbs the equilibrium and adds impurities to the atmosphere in the clean room. While it will still be necessary, from time to time, for operators to enter the clean room, the frequency of the entry is very greatly reduced, and, thus, the quality of the product is improved and the lost product, due to poor quality, arising from non-equilibrium operating conditions is greatly reduced.

A suitable embodiment of level sensor is described in connection with FIGS. 2 and 3. The level sensor 202 comprises an elongate, annular, thermally conductive sleeve 202 which may be made of any desired thermally conductive material, typically made of stainless steel, titanium, tantalum, or some other metal which is generally inert to a chemical environment. The level sensor shown comprises a first electric heater in the sleeve in thermal contact with a first zone of the sleeve at 204, and a first temperature sensor 206 in the sleeve in thermal contact with a second zone of the sleeve. The heater and the sensor are spaced, the space being shown at 208, from each other longitudinally along the sleeve. The heater and the temperature sensor are so constructed and so mounted in the sleeve as to be in thermal communication with each other substantially only through the sleeve. That is to say, there is very little temperature conduction across the space 208 that such heat as is transferred from the heater 204 to the temperature sensor 206 flows totally, or substantially totally, through the walls of the sleeve 202. The longitudinal position of the space 208, in the sleeve, defines an upper limit in the bubbler.

A lower level sensing assembly comprises a second electric heater 210 in thermal contact with a third zone of the sleeve, and a second temperature sensor 212 in thermal contact with a fourth zone of the sleeve, the second heater and the second sensor being spaced from each other longitudinally along the sleeve, the space being shown at 214, and being so constructed and so mounted in the sleeve as to be in thermal communication with each other, substantially only through the sleeve. Thus, the minimum level is defined by the location of the space 214.

An additional sensor 216 may be provided at the bottom of the sensor assembly to provide a warning signal, or for such other control purposes as may be desired. The heaters and the electrical sensing devices are mounted inside the sleeve by any suitable means, potting compounds typically being used. Mounts are shown at 220 and 222 for the first heater and first temperature sensor, at 224 and 226 for the second heater and second temperature sensor, and at 228 for the third sensor.

FIG. 3 shows the detail of the arrangement of one of these heater and temperature sensor assemblages, heater 204 being spaced from the temperature sensor 206. The electronic conductors 230 from the heater, and 232 from the sensor, which is typically a thermistor, extend upwardly up through the sleeve and are connected to suitable Wheatstone bridge or other balancing circuits in the transmitter assembly 200 shown in FIG. 1. The signal transmitted from the signaling device 200 through line 201 is, then, simply indicative of the temperature of the thermistors 206, 212 and 216. This temperature being a function of the level of liquid in the reservoir. As previously described, and as shown in FIG. 2, the temperature sensor is typically received in the sleeve 176, and, therefore, is in relatively close thermal contact with the liquid in the bubbler. When the liquid level is below the space 208, then the thermistor 206 will measure, approximately, the temperature of the heater 204, since the heat generated in the heater 204 will flow through the sleeve 202 and cause the thermistor 206 to be at approximately the same temperature, or a relatively constant lower temperature, as the heater 204. When, however, the liquid rises above the space 208, the temperature sensed by the thermistor 206 will be more a function of the temperature of the liquid in the bubbler than of the heater 204. Thus, the temperature measured by 206 is a function of whether or not the liquid level is at or above the space 208. Likewise, the temperature measured by the thermistor 212 is more a function of the liquid level, relative to the space 214, than of the temperature of the heater 210.

Any liquid level sensing system may be used in the overall system of this invention. Conventional pressure differential sensors, wherein the pressure required to force fluid into a body of liquid is measured may, for example, be used. The previously described thermal sensor may, advantageously, be used. Particularly advantageous use may also be made of the photodiode sensor depicted in FIG. 4, to which reference is now made.

FIG. 4 depicts a portion of the bubbler 170, although the same sensors described here may be used in the reservoir, in which the sensor well 176 is located. An elongate photodiode sensor 240 extending from at upper liquid level to at least the lower or minimum liquid level is disposed in the well, the well and the bubbler in this instance being of transparent or translucent material. The electrical leads 242 and 244 connect to a microprocessor 246 which gives an output which is a function of the amount of light striking the photodiode 240. An elongate light source 250 and diffuser 252 provide a source of light which is substantially uniform from at least the minimum to the maximum liquid level. A single light tube, or a multiplicity of light emitting elements, e.g., light emitting diodes, may be used. Indeed, any light source which provides a uniform light as described, may be used. Preferably, a slit system 254 defines the light beam directed toward the photodiode 240 through the wall of the bubbler 170, and the liquid contained therein. The liquid will absorb, diffuse, and reflect light from the source, and, thus, the presence of liquid along a portion of the sensor length will reduce the amount of light striking the diode below the liquid level. The output of the photodiode is a function of the total light striking the diode; consequently, the output signal will be in direct proportion to the level of liquid in the bubbler. Photodiodes of the type described are known and are available from Vactec Company, St. Louis, Mo., USA. The other components may be of individual manufacture, or conventional off-the-shelf light sources, diffusers, etc.

Another advantageous level sensor is depicted in FIGS. 5 and 6, wherein electrical capacitance differences resulting from liquid level differences are sensed. Referring first to FIG. 6, the sensor in this instance is also located in the sensor well 176, though one significant advantage of this invention is that no well is required, and the walls of the container may be opaque. In this example, however, the sensor comprises a rod or tube 260 to which a plurality, in this example four, capacitor electrodes 262, 264, 266 and 266 are affixed in spaced relation, and are connected by suitable leads 270, 272, 274 and 276 to a microprocessor and signal source. The electrodes may simply be strips of conductor, e.g., aluminum, tantalum, etc., secured to or deposited on the tube, the tube being an electrical non-conductor such as glass, polymer, etc. Preferably, however, the electrodes are generally triangular, with the base being at the top where the electric leads are connected, and the apex being at the bottom, the altitude being many times greater than the base, the specific configuration being so constructed and arranged on the rod and the change in capacitance as to give linear output as a function of liquid level.

FIG. 6 depicts the electrical connection to the electrodes of the sensor shown in FIG. 5. Leads 270 and 274 are connected to a signal source 278 and leads 272 and 276 are connected to a microprocessor 280 which receives and measures the amount of signal capacitively coupled from the electrodes 262 and 266 to the electrodes 264 and 268. The microprocessor may measure either amplitude or frequency. Amplitude measurement may be direct, i.e., a direct measure of the amplitude of the coupled signal. Frequency measurement may also be used, in which case separate electrodes are not required For example, electrodes 264 and 268 may be the capacitor of a tuned circuit, the resonant frequency of the tuned circuit then being a fraction of the capacitive coupling between the electrodes and, hence, a function of the liquid level. The exact shape of the electrodes required to give a linear response to liquid level change depends upon the dielectric constant of the liquid, but is easily determined by a few trials. For example, two electrodes having differing altitude/base ratios are tested and the signal measured. The proper altitude/base ratio may then be extrapolated from these data Usually another set of electrodes bracketing the desired ratio is used to achieve optimum performance. These are routine refinements within the skill of an electronic technician, however FIGS. 7 and 8 depict an alternative construction of the sensor of FIGS. 5 and 6 which comprises a sandwich structure 290 wherein the electrodes 292, 294, 296 and 298 are sandwiched between layers 290a and 290b of insulating film of a suitable non-conductive polymer. The thickness of the electrodes is exaggerated in FIG. 8 for clarity in visualization. The electrodes may, of course, be very thin foils, or even vapor or electrolytic deposits on the film surface.

The electrodes may also simply be alternating linear strips connected by a common bus, or in virtually any desired configuration. A non-linear output is quite satisfactory, and compensation may be made by appropriate scale readings or digital conversion. The frequency of operation is not identical, but should be above ambient signals in the plant environment. Signals of about 400 khz plus or minus about 200 khz are suitable, though no criticallity has been found in this range, and other frequency signals may be used. This range is convenient, however, because components for operation in this range are small, non-critical and readily available. Zero adjustment, range adjustment, etc., are easily achieved using trimmers as is the conventional practice.

Attention is now directed to the aspects of enclosing the conduit system in an inert atmosphere. Reference is made first, in this respect, to FIG. 9. FIG. 9 depicts a cross section, enlarged, of the conduit 156, and its enclosure 166. The conduit 156 is composed of an inert material. The term "inert" means, in the context of this disclosure, that the material is inert to the reagent which is being handled Quite obviously, a material may be inert to one reagent, but not to another. A material is considered to be inert, for purposes of this invention, if it is inert to the reagent which is transferred from the refill reservoir to the bubbler. In the present invention, a preferred inert material is polytetrafluoroethylene, sold under the trademark TEFLON, as well as under other marks, and other fluorinated polymers. TEFLON is ideally suited, from the point of its chemical inertness, to the present invention. However, TEFLON is permeable to oxygen and moisture. While this permeability may not be a serious problem in many contexts, it becomes very serious where ultrahigh purity reagents of the type under consideration are being transported. In order to assure the purity of the reagent, and also to provide an extra measure of safety, the conduit 166 encloses the conduit 156, and the space between these two conduits is maintained at a positive pressure with inert gas. This prevents any permeation of oxygen or moisture into the reagent, and, should there be a failure of the conduit 156, the conduit 166 is sufficiently resistant to the reagent to contain it for an extended period of time The conduit 166 would typically be made of stainless steel It is to be understood that the use of the envelope around the conduit is an important facet of the invention, but is not critical to the operation of the system as described. It would be possible, although expensive and not particularly desirable in many instances, to make the entire conduit system out of a highly resistant metal, which is not permeable to gases or moisture, and which is inert to the reagent. For example, it would be possible, at least theoretically, to construct the entire system out of tantalum. This would be extremely expensive and would not normally be suitable for a production facility.

Figure 10:
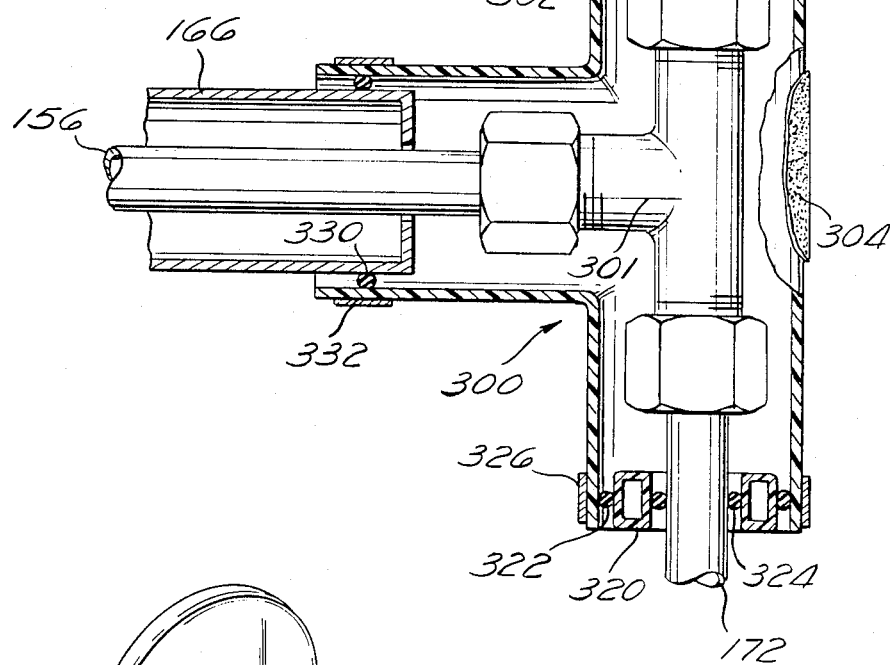
FIG. 10 is a side view, in partial cross-section, of one configuration of an envelope enclosed valve according to this invention.

FIG. 10 depicts an enclosure of a valve. The general concept of the enclosed valve is shown in FIG. 1, wherein valve 160 is maintained in an inert atmosphere within an enclosure 168. A specific embodiment is shown in FIG. 10, in which a valve 301, of conventional design composed of polytetrafluoroethylene, or other suitable polymeric material, is connected to the conduit 156 and to the bubbler input line 172. This valve 301 may be of a conventional type, or it may be custom designed. It is shown here simply as illustrative of the enclosure, and the details and operation of the valve are of no consequence insofar as this particular teaching is concerned. Valves, such as valve 160, are well-known and would normally be used in the location shown in FIG. 1 where the entire enveloped valve is shown generally at 300. The assembly 300 comprises the valve 301 and an envelope 302. The envelope 302 may, preferably, be composed of polytetrafluoroethylene to which a metal layer 304 has been bonded to prevent moisture and oxygen permeability. The valve enclosure is sealed at one end by a spacer 310, and a pair of O rings 312 and 314 which provide a gas tight seal around the stem of the valve. This seal is held in place by a band 316 which may be of any conventional design. Conventional band clamps may be suitably used in this location. A similar configuration is shown in the lower area of FIG. 5 in which a spacer 329 and a set of O rings 322 and 324 seal the valve enclosure 302 to the conduit 172, the sealing arrangement being held in place again by a band 326. Likewise, an O ring 330 seals the enclosure to the conduit enclosure 166, the O ring being held in place in a gas tight relationship by means of a band 332. It will be noted that there is a space between the conduit 156 and the enclosure 166 to permit pressurization of the valve envelope by the inert gas flowing through the envelope 166. Separate inert gas pressurizing means may be provided if desired, however.

Figure 11:
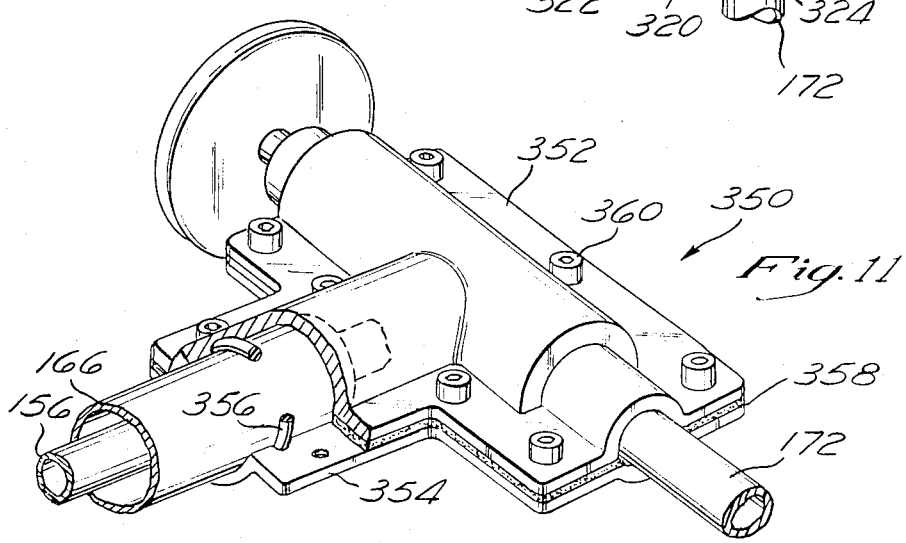
FIG. 11 is a perspective view, in partial cross-section and cutaway, of another configuration of an enclosed valve which may be used in this invention.

An alternative embodiment showing the same concept is shown in FIG. 11, the general assembly being shown at 350. In this embodiment, the envelope comprises two clam-shell halves, 352 nd 354, sealed by appropriate O rings, as shown at 356, and gaskets as shown at 356 and held together with suitable bolts or screws 360.

It is to be understood with respect to the enclosed conduit system, which comprises both the conduit and valving enclosed in suitable gas tight, or substantially gas tight enclosure mechanisms, and filled with inert gas, that the specific configuration, construction and operation of the valve is of secondary significance, and any valve may be used. What is significant is that the entire conduit system, or a substantial portion of the conduit portion, sufficient to protect the conduit system and prevent contamination through the walls of the conduit system, is enclosed in one or more envelopes filled with inert gas.

The refill reservoir system, including the reservoir and the valve of unique configuration, and in a unique relationship with the reservoir, comprises a very advantageous and highly preferred embodiment of the invention. It is to be understood, however, that the invention may be used, in its overall system concept, with any refill reservoir.

Figure 12A:
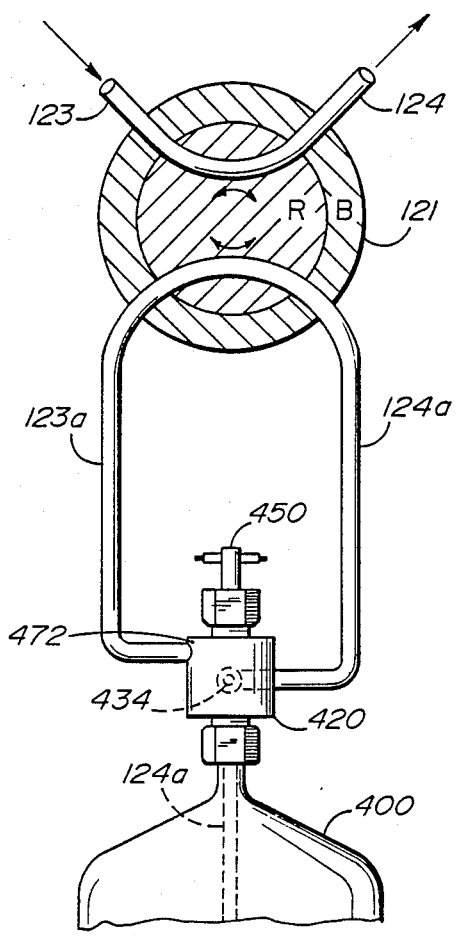
FIGS. 12A and 12B depict a portion of FIG. 1, enlarged, wherein the reservoir shown in FIG. 12 is used showing the valve 121 schematically in cross-section to illustrate the function performed thereby, valve 121 being closed in FIG. 12A and open in FIG. 12B.
Figure 12B:
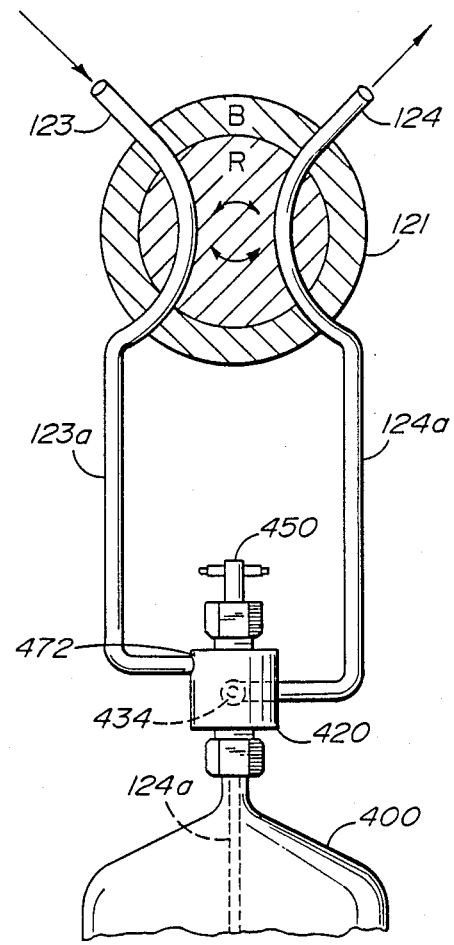

The refill reservoir is shown in FIGS. 12–14 to which reference is now made.

Referring first to FIG. 12, the refill reservoir comprises a large reservoir container 400. This reservoir container generally speaking would be made of quartz in a suitable shock-proof metal or high-impact polymer container. All that is important, however, is that it be inert. The term inert meaning, as previously defined, that it is nonreactive with the reagent to be contained therein. Quartz is generally nonreactive with almost all reagents, but in some instances it would be preferable to use other materials which would be inert to the particular reagent contained therein. An alternative composition and construction is shown, in partial crosssection, in FIG. 13, in which the container is formed of a polymer such as polytetrafluoroethylene, shown at 401a enclosed in a metal container 401b. The metal container may be independently formed, or may be a coating on the polymer.

With respect to the relationship of valve 121 to valve 420, it must first be recognized that in FIG. 1, the entire system is shown in a schematic form whereas FIGS. 12 through 19 show a particular container which may optionally be used with the invention and would correspond to the container 102. There is, therefore, no particular structural relationship involved. When the reservoir 400 is being used in the system and would, thus, correspond to the reservoir 102, then the valve body 420 and valve assembly would be in the top of the reservoir located at the point where the conduits 123a and 124a extend down into the reservoir. In a simplified version of the system as shown in FIG. the conduits, 123a and 124b can simply extend down through a stopper. Obviously, this is not a particularly satisfactory approach, but the system in FIG. 1 does not necessarily require any particular closure for the reservoir. The valve 420 comprises, however, one particular closure for a reservoir of a particular configuration. Thus, the valve 121 merely directs gas to and accepts liquid from the reservoir through any suitable mechanism, which may include the valve 420 or any other mechanism, or, in the alternate position, simply bypasses the reservoir entirely. FIG. 12A depicts a portion of the system depicted in FIG. 1, as described, in which the reservoir which is generally identified by numeral 102 in FIG. 1 is of the type identified as 400, the valve 121 being shown in closed position, i.e. the reservoir is closed to communications with the gas conduit system. FIG. 12B depicts the same portion of FIG. 1 as is depicted in FIG. 12A, but with the valve 121 being shown in the open position, i.e. in which the gas pressure is in communication with and pumps the liquid in the reservoir. As previously pointed out, valve 121 may be any conventional four-way, two-position valve. A valve of this well-known type is disclosed, inter alia, in U.S. Pat. No. 3,106,844, Oct. 15, 1963, to J. Sonnberg wherein a rotary valving member "R" is mounted in a body "B" to perform the valving function.

A very important aspect of the refill reservoir of this invention, in this preferred embodiment, is the provision of a withdrawal tube 402 which extends from proximate the bottom of the container, and is spaced in the center by a spacer 404, of a neck portion 406 of the reservoir. A detailed view in partial cross-section and cutaway of this arrangement is shown in FIG. 9 in which the withdrawal tube 402 is spaced concentrically by means of a spacing mechanism 404 in the neck 406 of the container.

The refill reservoir is closed after filling by means of a seal 410 which is best shown in FIGS. 17 and 18. The reservoir, then, comprises a unique construction comprising a container forming a reservoir and a reduced neck portion, a withdrawal tube supported in the container, the upper end of the withdrawal tube extending into the neck portion of the container, and a breakable seal 410 across the neck of the container, spaced from the proximate end, i.e., the upper end of the withdrawal tube in the neck portion.

This refill reservoir is best used in connection with a breakseal valve assembly as shown in FIGS. 15, 16 and 17, and also in FIGS. 12, 18 and 19, to some extent.

The valve is best described with principal reference to FIG. 17, making reference where appropriate to FIGS. 12, 15, 16, 18 and 19. The valve comprises a body 420 from which a lower extension portion 422, which is threaded on the outside, extends. The valve body 420 is preferably made of polytetrafluoroethylene and preferably comprises a metal coating 424 on the outside to give the entire valve assembly resistance to gas permeation. Internal to the body and the extension 422 is a passageway 426 which has formed therein a shoulder 428, and an enlarged passage portion. The enlarged passage portion and the shoulder 428 are so configured and dimensioned as to receive in a substantially gas tight relationship the top of the neck 406 of the refill reservoir 400. The body has formed therein another passageway portion 430. An enlarged annular space 432 is also formed which is in fluid communication with the outlet port 434 of the valve. A valving member having a cylindrical sealing portion shown at 436 is slightably received in the passage 430 in substantially gas tight, moveable relationship therewith.

The body 420 also has an upper extension 438 which is also threaded to receive a clamping nut as will be described.

Lateral passages 440 and 442 extend inwardly from the exterior of the body and are plugged at their outer end, as shown. These two passages, 440 and 442 are connected by a third passage 444, the end of which is also plugged. The passages 440, 442, and 444 provide a second passage, independent of the first passage, in communication with the passage 426 which is in communication with the top portion of the reservoir when the valve is in the open position. The valving member, shown generally at 450, comprises a shaft 451, a knob or handle 452, and a threaded portion 453 which is threadably engaged in the threads 454 on the interior of the upward extension of the body 438. An annular space 455 is formed between the shaft 451 and the slideable portion 456, which is in gas tight, reciprocal sliding relationship with the interior 436 of the passage 430.

Formed inside the valving member is a vertical passage 460, and a lateral passage 462 in communication therewith. The bottom end of the passage 460 is enlarged, as shown at 464, and, preferably, has a beveled entryway thereinto for receiving in substantially gas tight sealing relationship the upper end of the withdrawal tube 402. A breaking sleeve 466 is preferably provided around the circumference of the lower end of the valving member. The breaking member may be made of tantalum, or any hard or rigid material sufficient to break the seal 410.

In addition to the outlet port shown at 434, a passageway 470 communicates with an inlet port 472, as best shown in FIG. 16. FIG. 16 is a top view taken of FIG. 12, the port 472 and the passageway 470 being on the opposite side of the valve as shown in FIG. 17. The port 470 communicates with the passageway 430, and is substantially at the same vertical location in FIG. 17 as in the passageway 440, but is oriented 90 degrees therefrom.

A pair of tightening caps are provided, as shown in FIG. 15, to secure the valving member in place and also to secure the valve to the neck of the container. These caps are of any conventional design for providing a gas tight seal and are shown generally at 480 and 482 in FIG. 15. They are omitted from FIG. 17 and also from FIG. 12 to permit better illustration of the valve.

The entire refill reservoir, including the valve assembly, is preferably contained in a stainless steel cylinder 490. In the preferred embodiment, although certainly not essential or particularly necessary to the invention, the valve is connected by means of the output conduit 492, which is threadably received in the outlet port 434, outside the cylinder, and the cylinder is filled with a potting compound 494, or simply with granular vermiculite.

The operation and function of the valve and its interrelationship with the refill reservoir may now be considered making particular reference to FIGS. 12, 17, 18, and 19. The view shown in FIG. 12 shows the valve in place with the valving member in its downward most position, the valve being open. In FIG. 17, the valve is shown in its upward position, the valve being closed. Consideration will be given first to the closed position of the valve as shown in FIG. 17.

In the closed position of the valve, the valving member is in the upward position, and the lower end of the valving member, which has the passageway 464 formed therein, and has the breaking cylinder 466 thereon, is spaced above the seal 410 on the refill reservoir. The output conduit 434 is closed off in that it is not in fluid communication with anything other than a passageway in the valve. Likewise, the passage system 440, 442, and 444 is closed, being closed off from any fluid communication with the outside. In this configuration, a vacuum may be drawn on the output conduit 434 which will totally evacuate the passageway 432, the passage 430, and the passage system 440-444, and also will evacuate the passage system 460-464 in the valving member. Thus, all of the internal space in the valve may be evacuated, purged and flushed as many times as desired to assure that it is either totally evacuated or filled with an inert gas.

In the upward position, the tip end of the valving member, best shown in FIG. 18, is positioned above the breakseal 410. As will be apparent from an examination of FIG. 18, as the valving member is moved downwardly, the breaking member 466 will contact and break the seal 410. This is done only after the entire valve passageway network has been evacuated and purged.

Reference is now made to FIGS. 12 and 19 in which Figures the valving member is in the down position, and the valve is open. As shown best in FIG. 19, the lower end of the valving member, with its enlarged end portion 464, fits snugly over the upper end of the withdrawal tube 402, forming a substantially fluid tight seal therewith. The seal 410 has been broken by the downward movement of the valving member, thus permitting fluid communication from the interior of the reservoir through the passageway network beginning with passage 442. Referring now to FIGS. 12 and 16, it will be apparent that inert gas entering the input port 472 in the passage 470 will flow through the annular space defined by the reduced portion 455 of the valving member, and the passageway 436. The inert gas will flow through the passageway 440, 444, and 442, and into the upper portion of the refill reservoir, pressurizing the refill reservoir. The pressure on the top of the reagent in the refill reservoir will force the reagent to flow upwardly through the withdrawal tube 402, through the passage 460 and 462 to the withdrawal port 434, and then through the outlet conduit 492.

In use, the refill reservoir is received with the seal 410 in place, and preventing any gaseous contact with the contents of the container, a suitable protective cap may be placed over the entire neck to protect the breakseal 410. In a preferred embodiment, though not necessary to the invention, the valve is already in place when the refill reservoir is shipped. The valve may be provided by the end user, however. For the exemplary embodiment the discussion will focus upon shipment of the container with the valve in place.

The supplier of the reagent will fill the reservoir with the reagent, place the seal 410 in its proper place and seal it to assure a gas tight seal of the contents. The seal 410 may be secured in place by a tight fitting connection to the neck, using polytetrafluoroethylene O rings, gaskets or the like. The breakseal may, in this form, be a film of metalized polytetrafluoroethylene. The breakseal may, also, be formed of quartz or pyrex, using conventional glass blowing techniques. In this configuration, the thin quartz seal breaks when the valving member is forced down upon it. In the preceding configuration, it is simply ruptured as the valving member is forced upon it. Other seals may also be envisioned, but these are sufficiently illustrative of the exemplary embodiment.

In the exemplary embodiment, the valve is then placed on the refill reservoir, the reservoir is placed in the container and suitably protected with vermiculite or foamed polymer, or other material as may be desired. The container is then shipped, being in a very safe configuration because of the breakseal and because of the additional protection of the unique valving arrangement. Upon receipt, the user, assuming as in the exemplary embodiment that the valve is in place, simply connects the valving assembly to the use system, evacuates and purges sufficiently to assure that the valve and the conduit system are free of contamination and, then opens the valve. By the single act of opening the valve, screwing the valving member downwardly or otherwise moving it as the valve design may dictate, thus in one single action breaking the seal and establishing fluid communication from the inlet port for the inert gas to the upper portion of the reservoir, and through the withdrawal tube through the outlet port for the reagent. If the valve were not in place, the user would simply put the valve in place and proceed as described. In this facet the invention provides a very convenient, safe, and efficient manner of shipping large volumes of reagent for refilling bubblers or comparable gas-liquid contacters, or any contacter in which it is desired to contact a gas stream with liquid.

INDUSTRIAL APPLICATION

This invention finds industrial application in the semiconductor industry, and will find application in any industry where high purity reagents are carried in a gas stream.

What is claimed is:

1. A system for providing chemically reactive vapor from a bubbler to silicon wafer treating furnaces and the like, comprising, in combination:
    (a) a refill reservoir 102 for containing and dispensing ultrahigh purity highly chemically reactive reagent;
    (b) at least one bubbler 170 comprising a reagent reservoir, an inlet tube 172 for introducing inert gas into the reservoir below the surface of the reagent to cause said gas to bubble inwardly through the reagent, an outlet tube 174 for carrying inert gas at least partially saturated with reagent vapor from the bubbler;
    (c) means 104-108, 120-168) including a conduit system for periodically (i) transferring reagent from the refill reservoir through the conduit system into the bubbler and (ii) flushing reagent out of the conduit system and filling the conduit system with inert gas, substantial portions of the conduit system being formed of material which is inert to the reagent conducted therethrough, but permeable to moisture vapor or oxygen or both;
    enclosure means substantially enclosing the reservoir and the conduit system, said enclosure means being formed of material which is reactive with the reagent but impermeable to moisture vapor and oxygen; and
    means for maintaining an inert atmosphere in said enclosure.

2. The system of claim 1 further comprising:
    (d) means (104-114, 120) for providing inert gas at a predetermined pressure to the enclosure to maintain the refill reservoir in an inert atmosphere.

3. The system of claim 2 further comprising:
    (e) means (104-108, 120-124) for providing inert gas at a predetermined pressure and rate to the refill reservoir.

4. The system of claim 2 further comprising:

(e) means (104–108, 120–130, 134–168, or 104–108, 120, 160, 161, 184–192) for transferring inert gas into the bubbler to be at least partially saturated with reagent.

5. The system of claim 1 further comprising:

(d) means (104–114, 120) for providing inert gas at a predetermined pressure to the enclosure to maintain the refill reservoir in an inert atmosphere;

(e) means (104–108, 120–124) for providing inert gas at a predetermined pressure and rate to the refill reservoir;

(f) means (104–108, 120–130, 134, 168, or 04–108, 120, 160, 161, 184–192) for transferring inert gas into the bubbler to be at least partially saturated with reagent; and (g) means (174, 178) for transferring at least partially reagent saturated gas from the bubbler to the furnace.

6. A system for providing chemically reactive vapor carried in an inert gas stream comprising, in combination:

(a) a refill reservoir for containing and dispensing high purity highly chemically reactive reagent;

(b) at least one gas-liquid contacter for at least partially saturating an inert gas stream with reagent vapor;

(c) means comprising a conduit system for periodically (i) transferring reagent from the refill reservoir through the conduit system into the contacter, substantial portions of the conduit system being formed of material which is inert to the reagent conducted therethrough but permeable to moisture vapor or oxygen, or both, (ii) flushing reagent out of the transfer means, (iii) filling the transfer means with inert gas, and (iv) maintaining the transfer means under pressure with inert gas between the periodic transfer of reagent;

(d) enclosure means substantially enclosing the conduit system, said enclosure means being formed of material which is reactive with the reagent but impermeable to moisture vapor and oxygen; and (e) means for maintaining an inert atmosphere in said enclosure:

7. A system for providing chemically reactive vapor comprising, in combination:

(a) a refill reservoir 102 for containing and dispensing ultrahigh purity highly chemically reactive reagent;

(b) at least one bubbler 170 comprising a reagent reservoir, an inlet tube 172 for introducing inert gas into the reservoir below the surface of the reagent to cause said gas to bubble upwardly through the reagent, an outlet tube 174 for carrying inert gas at least partially saturated with reagent vapor from the bubbler to a furnace reservoir;

(c) means (104–108, 120–168), including a conduit system for periodically (i) transferring reagent from the refill reservoir through the conduit system into the bubbler, (ii) flushing reagent out of the conduit system, substantial portions of the conduit system being formed of material which is inert to the reagent conducted therethrough but permeable to moisture vapor or oxygen or both, (iii) filling the conduit system with inert gas, and (iv) maintaining a predetermined pressure of inert gas in said conduit system between the periodic transfer of reagent therethrough;

(d) a substantially gas tight enclosure 100 for the refill reservoir and the conduit system for transferring reagent from the refill reservoir to the bubbler, said enclosure means being formed of material which is reactive with the reagent bu impermeable to moisture vapor and oxygen;

(e) means (104–114, 120) for providing inert gas at a predetermined pressure to the enclosure to maintain the refill reservoir in an inert atmosphere;

(f) means (104–108, 120–124) for providing inert gas at a predetermined pressure and rate to the refill reservoir;

(g) means (104–108, 120–130, 134–168, or 104–108, 120, 160, 161, 184–192) for transferring inert gas into the bubbler to be at least partially saturated with reagent and (h) means (174, 178) for transferring at least partially reagent saturated gas from the bubbler.

8. The system of claim 7, wherein the conduit system of means for periodically transferring reagent comprises an inert conduit comprised of a chemically inert polymeric material, and an outer conduit of gas and moisture impervious material, and further comprising means for maintaining an inert atmosphere between the inner and the outer conduits.

9. The system of claim 7, wherein the conduit system of means for periodically transferring reagent comprises an inner conduit comprised of a chemically inert polymeric material, and an outer conduit of gas and moisture impervious material, and at least one valve enclosed in a substantially gas tight enclosure, and further comprising means for maintaining an inert atmosphere between the inner and the outer conduits, and inside the enclosure around the valve.

10. A system for providing chemically reactive vapor to a bubbler comprising, in combination:

(a) a refill reservoir for containing and dispensing ultrahigh purity highly chemically reactive reagent;

(b) at least one contacter comprising a reagent reservoir, an inlet tube for introducing inert gas into the contacter to cause said gas to contact the reagent, and an outlet tube for carrying inert gas at least partially saturated with reagent vapor from the contracter;

(c) means including conduit for transferring reagent during a first time period from the refill reservoir through the conduit into the bubbler, flushing reagent out of the conduit, filling the conduit with inert gas, and maintaining a predetermined pressure of inert gas in said conduit between the periodic transfer of reagent therethrough;

(d) means for feeding a stream of inert gas into the bubbler to be at least partially saturated with reagent only during a second time period, the first and second time periods alternating with time;

(e) a container forming a reservoir and a reduced neck portion;

(f) a withdrawal tube supported in the container, the upper end of the withdrawal tube extending into the neck portion of the container; and (g) a breakable seal across the neck of the container, spaced from the proximate end of the withdrawal tube in the neck portion.

11. The system of claim 10 further comprising:

(h) enclosure means for the conduit for transferring reagent into the bubbler; and (i) means for maintaining an inert atmosphere in said conduit.

12. The process of providing a stream of inert gas at least partially saturated with ultrahigh purity reagent which is highly reactive with oxygen and moisture to a reaction zone comprising the steps of:
   (a) maintaining a supply of the reagent in a refill reservoir in an inert, gas impervious shipping container;
   (b) transferring reagent from the refill reservoir to a gas-reagent contacter periodically through a conduit system, substantial portions said conduit system being formed of material which is inert to the reagent conducted therethrough but permeable to moisture vapor or oxygen or both;
   (c) flushing reagent out of the conduit system between each transfer of reagent;
   (d) maintaining the conduit system under inert gas pressure between each transfer of reagent;
   (e) passing a stream of inert gas through the contacter to at least partially saturate said inert gas stream in between each transfer of reagent,
   (f) providing an enclosure around the reservoir and conduit system, said enclosure being formed of material which is reactive with the reagent but impermeable to moisture vapor and oxygen; and
   (g) maintaining an envelope of inert gas around the refill reservoir and conduit in said enclosure.

13. The process of claim 12 further including the step of maintaining an envelope of inert gas around the refill reservoir.

14. The process of claim 13 further including the step of maintaining an envelope of inert gas around the conduit.

15. The process of claim 12 further including the step of maintaining an envelope of inert gas around the conduit.

16. The process of providing a stream of inert gas at least partially saturated with ultrahigh purity reagent which is highly reactive with oxygen and moisture to a reaction zone comprising the steps of:
   (a) passing a stream of inert gas through a gas-liquid contacter containing said reagent to at least partially saturate said inert gas stream;
   (b) maintaining a supply of the reagent in a refill reservoir in an inert, gas impervious shipping container;
   (c) periodically ceasing to pass the stream of inert gas through the contacter;
   (d) during said period of cessation, transferring reagent from the refill reservoir to the contacter through a conduit system, substantial portions said conduit system being formed of material which is inert to the reagent conducted therethrough but permeable to moisture vapor or oxygen or both;
   (e) flushing reagent out of the conduit system between each transfer of reagent;
   (f) providing and enclosure around the reservoir and conduit system, said enclosure being formed of material which is reactive with the reagent but impermeable to moisture vapor and oxygen;
   (g) maintaining the conduit system under inert gas pressure between each transfer of reagent; and
   (h) maintaining the conduit system in an inert atmosphere in said enclosure. reagent.

17. The process of claim 19 further comprising the steps of:
   (a) sensing the level of reagent in the contacter;
   (b) controlling the periods of cessation as a function of the reagent level; and
   (c) controlling the amount of reagent transferred as a function of the reagent level.

18. The process of claim 16 wherein the step of transferring reagent from the refill reservoir comprises initially forcing a conduit inwardly of the reservoir thereby breaking a breakseal to open the reservoir before the first reagent is transferred therefrom.

* * * * *